United States Patent [19]

Tihanyi

[11] Patent Number: 4,471,372

[45] Date of Patent: Sep. 11, 1984

[54] FET CONTROLLED TRIAC

[75] Inventor: Jenö Tihanyi, Munich, Fed. Rep. of Germany

[73] Assignee: Siemens Aktiengesellschaft, Berlin and Munich, Fed. Rep. of Germany

[21] Appl. No.: 265,860

[22] Filed: May 21, 1981

[30] Foreign Application Priority Data

May 23, 1980 [DE] Fed. Rep. of Germany ....... 3019883

[51] Int. Cl.$^3$ .................. H01L 29/747; H01L 29/78; H01L 27/02; H03K 17/60
[52] U.S. Cl. ....................................... 357/39; 357/23; 357/43; 357/51; 357/86; 307/252 B
[58] Field of Search ...................... 357/38, 86, 39, 51, 357/43, 23 R, 23 C, 23 VD; 307/252 T, 252 B, 311, 305

[56] References Cited

U.S. PATENT DOCUMENTS

| | | | |
|---|---|---|---|
| 3,360,696 | 12/1967 | Neilson et al. | 357/39 |
| 3,995,176 | 11/1976 | Sauvanet | 307/252 N |
| 4,199,774 | 4/1980 | Plummer | 357/41 |
| 4,244,000 | 1/1981 | Ueda et al. | 357/39 |
| 4,302,687 | 11/1981 | Yoshino et al. | 307/252 G |
| 4,331,884 | 5/1982 | Suedberg | 307/252 C |
| 4,331,914 | 5/1982 | Huber | 323/324 |

OTHER PUBLICATIONS

H. Eng., "The Field Effect Controlled Switch", Jul. 1970, Microelectronics, vol. 3, #7, pp. 36–38.

Primary Examiner—Andrew J. James
Assistant Examiner—John LaMont
Attorney, Agent, or Firm—Herbert L. Lerner; Laurence A. Greenberg

[57] ABSTRACT

Bidirectional thyristor or Triac, including a semiconductor body, first and second antiparallel-connected thyristor sections integrated in the semiconductor body, each of the thyristor sections having an anode side, a cathode side, an emitter zone on the cathode side, a base zone on the cathode side, an emitter zone on the anode side having a given conductivity type, and a base zone on the anode side, a field-effect transistor being integrated into the semiconductor body and having a control, a source, and a drain terminal defining a load path, the source terminal being connected to the emitter zone on the cathode side of the first thyristor section and the drain terminal being connected to the base zone on the anode side forming a connection through the load path of the field-effect transistor, an auxiliary zone having the given conductivity type of the emitter zone on the anode side of the second thyristor section, the auxiliary zone being disposed between the emitter zone on the cathode side of the first thyristor section and the emitter zone on the anode side of the second thyristor section, and a contact disposed on the auxiliary zone for connection to a control current source.

2 Claims, 7 Drawing Figures

FET CONTROLLED TRIAC

The invention relates to a bidirectional thyristor (Triac) with two antiparallel-connected transistor sections which are integrated in a semiconductor body and each have an emitter zone on the cathode side, a base zone on the cathode side, an emitter zone on the anode side and a base zone on the anode side.

Such a bidirectional thyristor, which will be called "Triac" hereinbelow for simplicity, is described for instance in U.S. Pat. No. 3,350,611. It substantially includes two antiparallel-connected thyristor sections which are integrated in a single semiconductor, the outer zones of which are each connected to each other through an electrode. The Triac is switched-on by feeding a control current to the base zone on the cathode side of one thyristor section. Depending on the size of the Triac, this control current must be in the order of magnitude of between 15 and 50 mA for reliable and fast firing. It is not possible to drive the Triac directly by a micro-computer of an LSI circuit, since these furnish in general only output currents in the order of 1 mA.

It is accordingly an object of the invention to provide a bidirectional thyristor or Triac which overcomes the hereinafore-mentioned disadvantages of heretofore-known devices of this general type, and to do so in such a manner that it can be driven with substantially lower drive power, and especially directly by micro-computers or LSI circuits.

With the foregoing and other objects in view there is provided, in accordance with the invention, a bidirectional thyristor or Triac, comprising a semiconductor body, first and second antiparallel-connected thyristor sections integrated in the semiconductor body, each of the thyristor sections having an anode side, a cathode side, an emitter zone on the cathode side, a base zone on the cathode side, an emitter zone on the anode side having a given conductivity type, and a base zone on the anode side, a field-effect transistor being integrated into the semiconductor body and having a control, a source, and a drain terminal defining a load path, the source terminal being connected to or located at the emitter zone on the cathode side of the first thyristor section and the drain terminal being connected to the base zone on the anode side forming a connection through the load path of the field-effect transistor, an auxiliary zone having the given conductivity type of the emitter zone on the anode side of the second thyristor section, the auxiliary zone being disposed between the emitter zone on the cathode side of the first thyristor section and the emitter zone on the anode side of the second thyristor section, and a contact disposed on the auxiliary zone for connection to a control current source.

In accordance with another feature of the invention, there is provided a substrate of a given first conductivity type having sides; the emitter zones on the cathode side of the thyristor sections and the source zone of the field-effect transistor (FET) being formed by zones of the given first conductivity type; the emitter zones on the anode side, the base zones on the cathode side, the control zone of the field-effect transistor and the auxiliary zone being formed by zones of a given second conductivity type; the zones of the second conductivity type being embedded in one side of the substrate of the first conductivity type, the zones of the first conductivity type being embedded in the zones of the second conductivity type, and the drain of the field-effect transistor and the base zones on the anode side of the thyristor sections being formed by the substrate.

In accordance with a further feature of the invention, the zones of the first conductivity type are formed by ion implantation.

In accordance with an added feature of the invention, the zones of the second conductivity type are formed by diffusion and have equal thickness.

In accordance with an additional feature of the invention, the control zone of the field-effect transistor (FET) is formed by ion implantation and is part of the base zone on the cathode side of the first thyristor section.

In accordance with again another feature of the invention, there is provided a substrate, the base zone on the cathode side of each of the thyristor sections and the emitter zone on the anode side of the other of the thyristor sections together form one of two regions embedded in the substrate, each of the regions including a relatively narrow strip making each region contiguous.

In accordance with again a further feature of the invention, there are provided contacts disposed on the emitter zones on the anode side, the regions being disposed on opposite sides of the substrate, and the emitter zone on the cathode side of each of the thyristor sections being opposite the contact for the emitter zone on the anode side of the other of the thyristor sections.

In accordance with again an added feature of the invention, the auxiliary zone is disposed in a recess formed in one of the regions being defined by the base zone on the cathode side of the first thyristor section, one of the strips, and the emitter zone on the anode side of the second thyristor section.

In accordance with yet another feature of the invention, there is provided a resistor connected between the auxiliary zone contact and the control terminal or electrode of the field-effect transistor (FET).

In accordance with a concomitant feature of the invention, there is provided another field-effect transistor being integrated in the semiconductor body and having a control terminal or electrode connected to the control terminal or electrode of the first-mentioned field-effect transistor, a source terminal, and a drain terminal defining a load path, the auxiliary zone contact being connected to an auxiliary voltage through the load path of the other field-effect transistor.

Other features which are considered as characteristic for the invention are set forth in the appended claims.

Although the invention is illustrated and described herein as embodied in a bidirectional thyristor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which.

Figure 1:
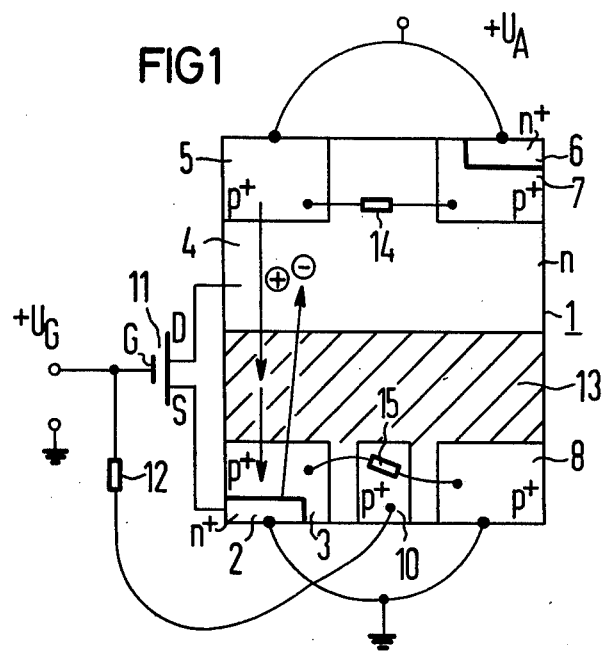
FIGS. 1 and 2 are schematic and diagrammatic views of a first embodiment example of the invention in two different operating states.

Referring now to the figures of the drawing and first particularly to FIG. 1 thereof, it is seen that a cross section through a semiconductor body 1 of a Triac is shown diagrammatically therein. The semiconductor body 1 contains two antiparallel-connected thyristor sections integrated in the semiconductor body. The first thyristor section of the left has a heavily n-doped emitter zone 2 on the cathode side, a base zone 3 on the cathode side, a base zone 4 on the anode side and an emitter zone 5 on the anode side. The corresponding zones of the antiparallel-connected second thyristor section on the right are 6, 7, 4 and 8, respectively. The emitter zone 2 of the first thyristor section on the cathode side is connected to the weakly n-doped base zone 4, which is common to the two thyristor sections, by the load path of an FET 11. The term "load path" is understood here to mean the path leading through the source zone, control zone, and drain zone of the FET. The terminals of the FET 11 are provided with reference characters S for the source zone, D for the drain zone and G for the control or gate terminal. An auxiliary zone 10 having the same conduction or conductivity type as the zones 3, 8, 5 and 7 is connected between the base zone 3 on the cathode side of the left-hand thyristor section and the emitter zone 8 of the other thyristor section. In the present case, this zone is heavily p-doped. Resistors 15 and 14 which serve in a known manner for improving the du/dt behavior are connected between the zones 3 and 8, and 5 and 7, respectively. The auxiliary zone 10 is electrically connected to the control terminal G of the FET 11 through resistor 12.

With the polarity of the voltage $+U_A$ shown, a space charge zone 13 which is shown as a shaded area, is built up in the zone 4. With this polarity, the first thyristor section is biased in the flipping direction and the pn-junction between zones 3 and 4 is cut off. If a control signal $+U_G$ is applied to the control input of the FET 11, the FET is switched into conduction and negative charge carriers flow from the zone 2 through the load path of the FET 11 into the zone 4. This causes emission of positive charge carriers from zone 5, which move in the direction of the zone 3. At the same time, zone 2 emits negative charge carriers which move toward the pn-junction between zones 3 and 4. The pn-junction between zones 3 and 4 is then biased in the flow direction and the first thyristor section is fired.

With the polarity shown, the second (right-hand) thyristor section is inoperative. The auxiliary zone 10 is likewise inoperative, since the pn-junction between the zone 10 and the zone 4 is blocked.

Since the FET 11 needs no current for switching-on except for a capacitive current flowing between the control terminal G and the source zone S, the Triac is switched on practically without power.

Figure 2:
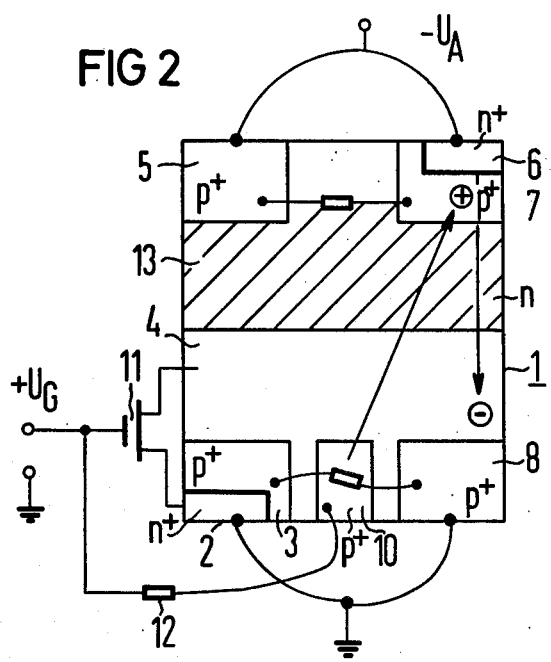

If the polarity of the voltage $(-U_A)$ is reversed, somewhat different conditions apply. These are shown in FIG. 2. It is evident that the second thyristor section will now be biased in the flipping direction, i.e. the pn-junction between the zones 7 and 4 will be blocked. If a positive signal is applied to the control input of the FET 11, the FET is switched into conduction. The signal potential "0" is therefore applied to the zone 4 in the space charge-free part. At the same time, a small control current flows into the auxiliary zone 10 through the resistor 12. The auxiliary zone emits positive charge carriers into the zone 4, since the pn-junction between zone 10 and zone 4 is now poled in the forward direction. Therefore, among other things, the positive charge carriers flow to the zone 7, which causes emission of negative charge carriers from the zone 6. This in turn causes emission of positive charge carriers from the emitter zone 8 on the anode side of the right-hand thyristor section. The pn-junction between the zones 7 and 4 is therefore biased in the flow direction and the second thyristor section is fired.

Figure 3:
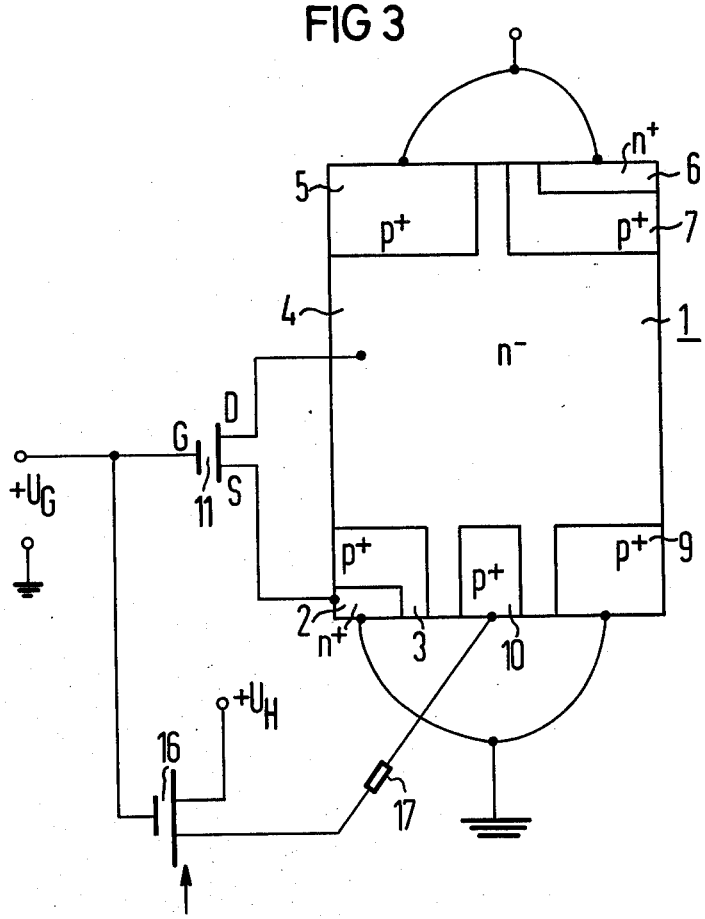
FIG. 3 is a view similar to FIGS. 1 and 2 of a second embodiment example of the invention.
Figure 4:
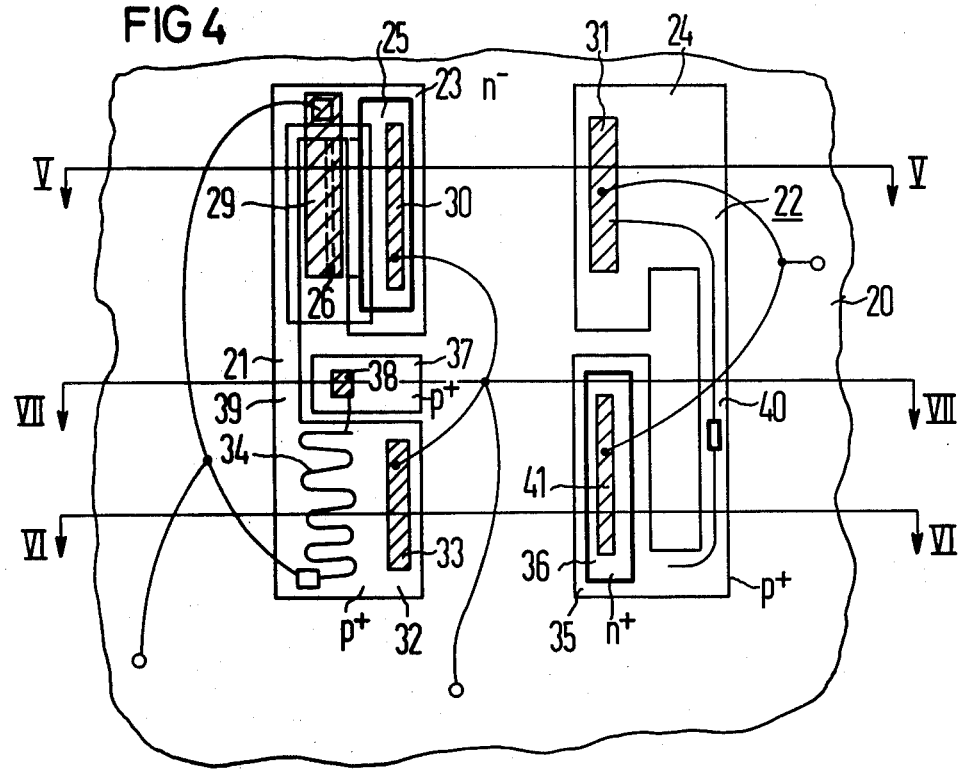
FIG. 4 is a top plan view of a lateral Triac which makes use of the principle according to FIGS. 1 and 2.

In the switching state according to FIG. 2, the control voltage source is loaded with a small current which is essentially determined by the resistor 12. This current may be about 1 to 5 mA. The load on the control voltage source, i.e. the microcomputer or the LSI circuit, can be further reduced if the arrangement according to FIGS. 1 and 2 is supplemented by an additional FET. Such an arrangement is shown in FIG. 3. In the FIG. 3 embodiment the auxiliary zone is connected to an auxiliary voltage source $-U_H$ through a resistor 17 and the load path of a second FET 16, which can be integrated in the semiconductor body. The control terminal of the FET 16 is electrically connected to the control terminal of the FET 11. The small control current thus does not come from the microcomputer in this embodiment but from a separate current source which must be provided in any event as the power supply of the microcomputer or the LSI circuit. The operation of the arrangement according to FIG. 3 is analogous to that according to FIGS. 1 and 2.

An operative lateral or planar embodiment of the Triac is shown in FIGS. 4, 5, 6 and 7. The construction and operation will be explained hereinbelow making reference to all of these figures.

The two thyristor sections and the FET are disposed on a substrate 20 which is weakly n-conducting. Two strongly p-conducting regions 21 and 22 are embedded in this substrate. The region 21 contains the base zone 23 of the first thyristor section on the cathode side and the emitter zone 32 on the anode side of the second thyristor section. The above-mentioned zones 23 and 32 are connected to each other by a narrow strip 39 which takes on the function of the resistor 15 in FIG. 1. The region 21 has a cutout which is defined by the zones 23 and 32 and by the strip 39. In this cutout there is located the auxiliary zone 37 which corresponds to the auxiliary zone 10 in FIG. 1. The zone 37 is provided with a contact 38, while the zone 32 has a contact 33.

The region 22 includes the emitter zone 24 on the anode side of the first thyristor section and the base zone 35 on the cathode side of the second thyristor section. These zones are connected to each other by a strip 40 which takes on the function of the shunt resistor 14 in FIGS. 1 and 2. The zone 24 is provided with a contact 31.

The zones 23, 24, 32, 35 and 37 and the strips 39, 40 are advantageously made by the same diffusion step and therefore have the same conduction or conductivity type and the same thickness. In the embodiment example shown, these zones are heavily p-doped. A zone 25 of the opposite conduction type is worked into the p-doped zone 23. The zone 25 forms the emitter zone on the cathode side of the first thyristor section. Similarly, a zone 36 of the opposite conduction type, which forms the emitter zone on the cathode side of the second thyristor section, is embedded in the zone 35. Zones 25 and 36 are advantageously prepared by ion implantation and have the same thickness. They are provided with contacts 30 and 41, respectively.

Figure 5:
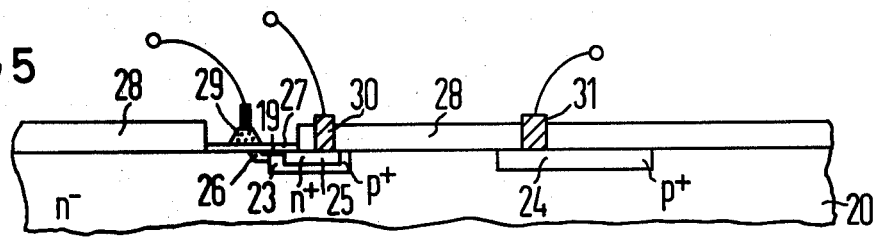
FIGS. 5, 6 and 7 are cross-sectional views through the Triac according to FIG. 4, taken along the lines V—V, VI—VI and VII—VII, respectively, therein, in the direction of the arrows.
Figure 6:
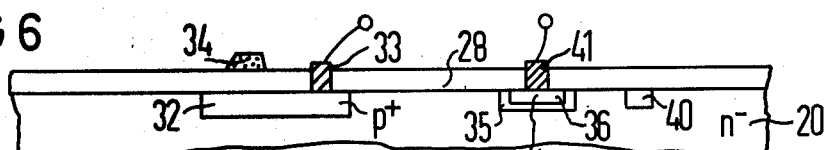
Figure 7:
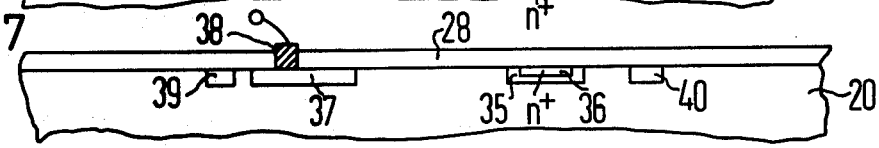

The control zone 26 of the FET is contiguous with the zone 23 of the first thyristor section. The zone 26 has the same conduction type but is made by ion implantation. The control zone 26 extends at an angle to the surface of the substrate as seen in FIG. 5 which can be achieved by a suitably formed mask. The control electrode 29 which is formed of polycrystalline silicon is used on the mask in this embodiment. The flanks of the electrode 29 are bevelled, so that an inclined arrangement of the control zone 26 in the substrate 20 is obtained. The source zone is contiguous with the emitter zone 25 on the cathode side of the first thyristor section and is designated with reference character 19. The base zone on the anode side of the thyristor sections and the drain zone of the FET are formed by the substrate 20.

The contact 38 of the auxiliary zone 37 is connected through a resistor 34 (corresponding to the resistor 12 in FIGS. 1 and 2) to the control input of the FET, i.e. to the control electrodes 29. The resistor 34 may be formed, for instance, of vapor-deposited polycrystalline silicon.

The regions 21 and 22 are advantageously disposed opposite each other in such a manner that the emitter zone on the cathode side of the first thyristor section is opposite its emitter zone on the anode side. The auxiliary zone 37 is advantageously opposite the emitter zone 36 on the cathode side of the second thyristor section, since these zones must interact electrically in the operating condition shown in FIG. 2.

The operational sequence of the lateral Triac according to FIGS. 4 to 7 corresponds to the scheme explained in connection with FIGS. 1 and 2. The connections between the electrodes or contacts 31 and 41, and 30 and 33, respectively, are represented by discrete lines. However, they are advantageously connected to each other by vapor-deposited conductor runs, for instance, as is customary in integrated circuits.

There is claimed:

1. Bidirectional thyristor or triac, comprising a semiconductor body, first and second antiparallel-connected thyristor sections integrated in said semiconductor body, each of said thyristor sections having an anode side, a cathode side, a first emitter zone on the cathode side, a first base zone on the cathode side, a second emitter zone on the anode side having a given conductivity type, and a second base zone of weak opposite conductivity type, a first field-effect transistor being integrated into said semiconductor body and having a control terminal, a control zone, a source zone, a source terminal, a drain zone and drain terminal defining a load path between the source terminal and the drain terminal, the load path of said first field-effect transistor being connected between said first emitter zone on the cathode side and said second base zone in the anode side of said first thyristor section, the source terminal being connected to said first emitter zone on the cathode side of said first thyristor section, and auxiliary zone having said given conductivity type of said emitter zone on the anode side of said second thyristor section, said auxiliary zone being disposed between said first emitter zone on the cathode side of said first thyristor section and said second emitter zone on the anode side of said second thyristor section, and a contact disposed on said auxiliary zone for connection to a control current source for controlling said second thyristor section, said second base zone adjoining said first base zone and said second emitter zone of said first thyristor section and said first base zone and said second emitter zone of said second thyristor section, and a resistor connected between said auxiliary zone and said control terminal of said first field-effect transistor.

2. Bidirectional thyristor or triac, comprising a semiconductor body, first and second antiparallel-connected thyristor sections integrated in said semiconductor body, each of said thyristor sections having an anode side, a cathode side a first emitter zone on the cathode side, a first base zone on the cathode side, a second emitter zone on the anode side having a given conductivity type, and a second base zone on the anode side of weak opposite conductivity type, a first field-effect transistor being integrated into said semiconductor body and having a control terminal, a control zone, a source zone, a source terminal, a drain zone and a drain terminal defining a load path between the source terminal and the drain terminal, the load path of said field-effect transistor being connected between said first emitter zone on the cathode side and said second base zone on the anode side of said first thyristor section, the source terminal being connected to said first emitter zone on the cathode side of said first thyristor section, an auxiliary zone having said given conductivity type of said emitter zone on the anode side of said second thyristor section, said auxiliary zone being disposed between said first emitter zone on the cathode side of said first thyristor section and said second emitter zone on the anode side of said second thyristor section, and a contact disposed on said auxiliary zone for connection to a control current source for controlling said second thyristor section, said second base zone adjoining said first base zone, and said second emitter zone of said first thyristor section and said first base zone and said second emitter zone of said second thyristor section, and a second field-effect transistor integrated in said semiconductor body and having a control terminal connected to the control terminal of said first field-effect transistor, a source terminal and a drain terminal defining a load path, said auxiliary zone contact being connected to an auxiliary voltage through said load path of said second field-effect transistor.

* * * * *